United States Patent [19]

Adachi

[11] Patent Number: 4,584,536
[45] Date of Patent: Apr. 22, 1986

[54] BALANCE CONTROL CIRCUIT

[75] Inventor: Hiroo Adachi, Saitama, Japan

[73] Assignee: Pioneer Electronic Corporation, Tokuo, Japan

[21] Appl. No.: 754,110

[22] Filed: Jul. 12, 1985

[30] Foreign Application Priority Data
Jul. 25, 1984 [JP] Japan .............................. 59-111602[U]

[51] Int. Cl.⁴ .......................... H03F 3/68; H04H 5/00
[52] U.S. Cl. ................................. 330/295; 330/124 R; 381/10; 381/24
[58] Field of Search .......................... 330/124 R, 29 S; 381/10, 24, 85, 104

[56] References Cited
U.S. PATENT DOCUMENTS
3,668,323  6/1972  Lee et al. ............................. 381/104

Primary Examiner—James B. Mullins
Assistant Examiner—G. Wan
Attorney, Agent, or Firm—Sughrue, Mion, Zinn Macpeak & Seas

[57] ABSTRACT

A balance control circuit for controlling the difference in volume between right and left audio stereo signals. DC output voltages of an amplifier provided in a preceding stage to the balance volume control circuit are utilized as bias voltages for amplifiers provided in the rear stage of the balance control circuit, and the sliding contacts of variable resistors are grounded through a single capacitor, with the result that the manufacturing cost of the circuit is reduced.

3 Claims, 2 Drawing Figures

BALANCE CONTROL CIRCUIT

BACKGROUND OF THE INVENTION

The present invention relates to a balance control circuit for controlling the difference in volume between right and left channels in a stereo system.

A conventional circuit of this type is constructed as shown in FIG. 1. In FIG. 1, reference characters Li, Ri and Gi designate input terminals to which audio stereo signals from circuits such as bass and treble circuits in a preceding stage are applied. A neutral potential (DC voltage) is superposed on the stereo signals. The terminal Li is connected through a resistor $R_1$ and a capacitor $C_1$ to a first terminal of a variable resistor $VR_1$, the second terminal of which is connected to a second terminal of a variable resistor $VR_2$. The terminal Ri is connected through a resistor $R_2$ and a capacitor $C_2$ to a first terminal of the variable resistor $VR_2$. The variable resistors $VR_1$ and $VR_2$ are adjusted to control the balance in volume levels between the right and left channels. Further, the first terminals of the variable resistors $VR_1$ and $VR_2$ are connected through capacitors $C_3$ and $C_4$ to respective buffer amplifiers formed by transistors $Q_1$ and $Q_2$. Each buffer amplifier can be used as an impedance conversion circuit, a voltage amplifying circuit, or an isolation circuit if it is disconnected from ground. Further in FIG. 1, $R_3$ through $R_6$ designate resistors for determining DC baises, and $R_7$ through $R_{10}$, resistors for determining gains.

In the buffer amplifiers, stereo signals are provided at the collectors of the transistors $Q_1$ and $Q_2$. These stereo signals are delivered through coupling capacitors $C_5$ and $C_6$ to output terminals Lo, Ro and Go and to the following stage. A resistor $R_{11}$ and a capacitor $C_7$ form a ripple-eliminating power source filter.

The capacitors $C_1$ through $C_4$ are coupling capacitors for preventing the variable resistors $VR_1$ and $VR_2$ from being damaged by DC currents, that is, they block the application of DC voltages to the resistors $VR_1$ and $VR_2$ from the adjacent stages.

The resistances of the resistors $R_1$ and $R_2$ and the variable resistors $VR_1$ and $VR_2$ are selected so that, when the sliding contacts of the variable resistors $VR_1$ and $VR_2$ are positioned at the first terminals of the latter as shown in FIG. 2, stereo signals applied through the input terminals Li and Ri are not significantly attenuated. When the sliding contacts are moved upwardly in FIG. 1, only the signal applied through the input terminal Li is attenuated, while the signal applied through the input terminal Ri is maintained unchanged. In contrast, when the sliding contacts are moved downwardly in FIG. 1, only the signal applied through the input terminal Ri is attenuated while the signal applied through the input terminal Li is maintained unchanged.

As is apparent from the above description, in the conventional balance control circuit, a number of coupling capacitors ($C_1$ through $C_4$) are needed to prevent the application of DC currents to the variable resistors $VR_1$ and $VR_2$. Therefore, the circuit is disadvantageous in that it is relatively high in manufacturing cost.

SUMMARY OF THE INVENTION

Accordingly, an object of the present invention is to eliminate the above-described difficulty accompanying a conventional balance control circuit.

More specifically, an object of the invention is to provide a balance control circuit having a balance volume control having amplifiers in its rear stage which is relatively low in manufacturing cost.

The foregoing object and other objects of the invention have been achieved by the provision of a balance control circuit adapted to control the balance between the right and left stereo signals and having amplifiers in the rear stage thereof in which, according to the invention, DC output voltages of amplifiers in a preceding stage to the balance volume control circuit are applied as bias voltages to the amplifiers in the rear stage of the balance volume control circuit, and the sliding contacts of variable resistors for selectively attenuating the stereo signals are grounded through a single capacitor.

The nature, principle and utility of the invention will become more apparent from the following detailed description when read in conjunction with the accompanying drawings, in which like parts are designated by like reference numerals on characters.

DESCRIPTION OF THE PREFERRED EMBODIMENTS

Figure 1:
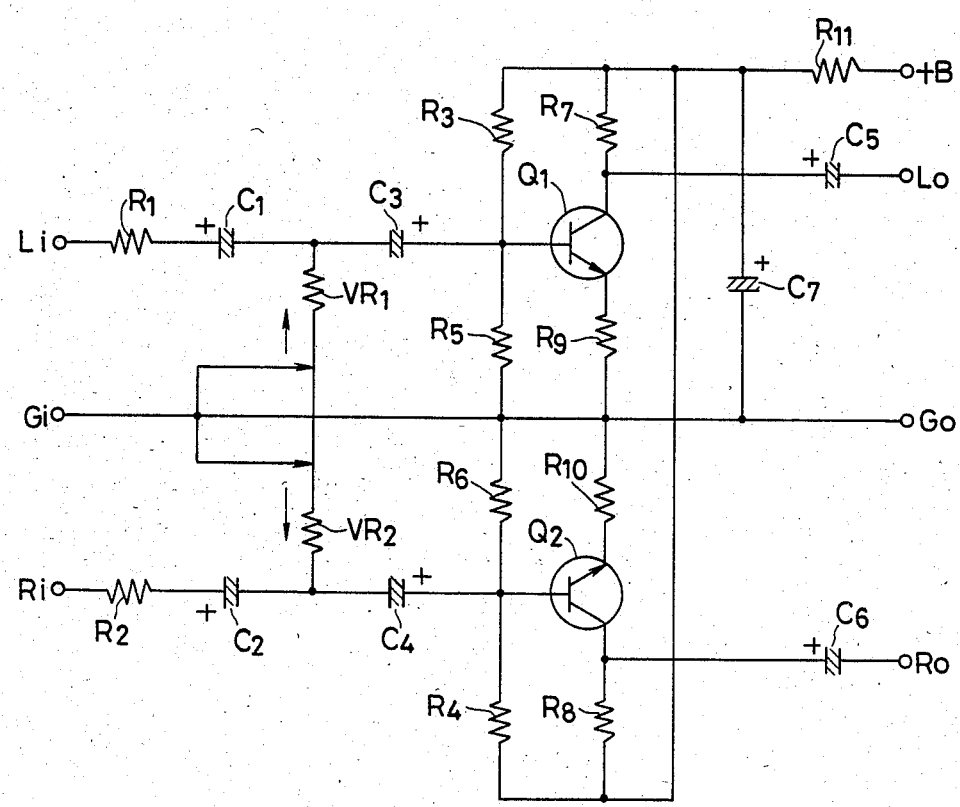
FIG. 1 is a circuit diagram showing an example of a conventional balance control circuit.
Figure 2:
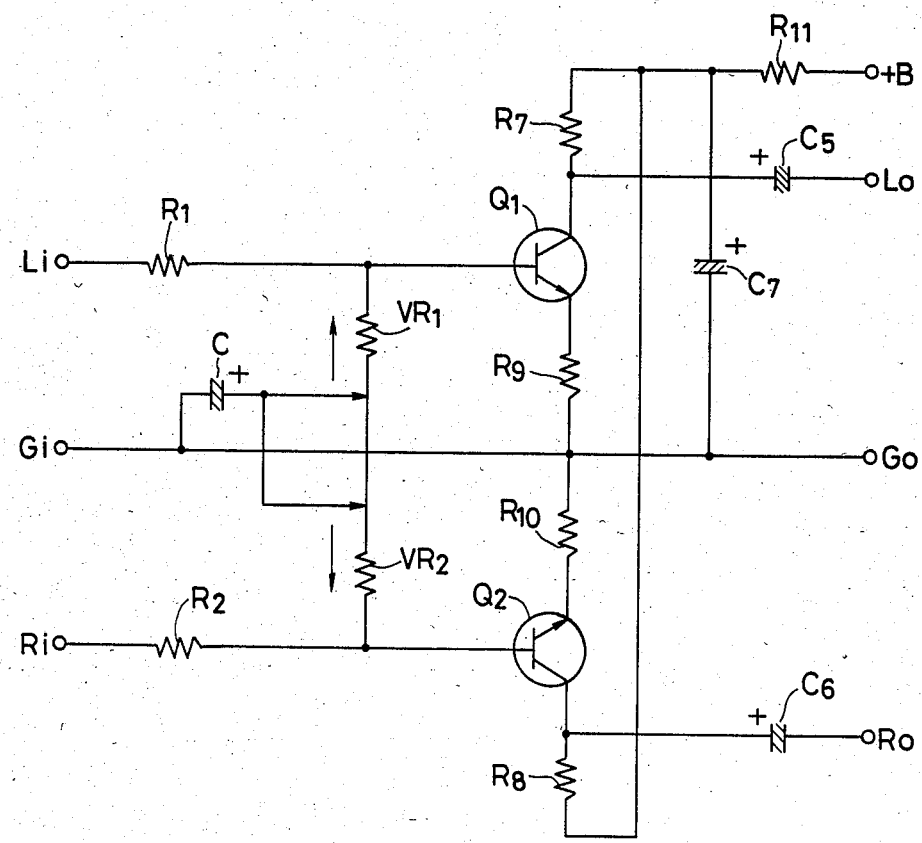
FIG. 2 is a circuit according to the invention.

An example of a balance control circuit according to the invention is as shown in FIG. 2. In FIG. 2, those components which have been previously described with reference to FIG. 1 are therefore designated by the same reference numerals or characters.

In the balance control circuit of the invention, the sliding contacts of the variable resistors $VR_1$ and $VR_2$ forming the balance volume control circuit are grounded through a common DC coupling capacitor C. The audio stereo signal input terminals Li and Ri are connected through resistors $R_1$ and $R_2$ to the bases of transistors $Q_1$ and $Q_2$, respectively. Therefore, the DC output voltages of the amplifiers provided in a stage preceding the balance volume control circuit are applied as bias voltages to the transistors $Q_1$ and $Q_2$. As is apparent from a comparison of FIGS. 1 and 2, the bias setting resistors $R_3$ through $R_6$ and the coupling capacitors $C_1$ through $C_4$ of FIG. 1 are not employed in the balance control circuit in FIG. 2.

The DC output voltages of the amplifier in the front stage of the balance volume control are set to values which are sufficiently high to drive the buffer amplifiers composed of the transistors $Q_1$ and $Q_2$ without exceeding the breakdown characteristics thereof.

In the balance control circuit thus constructed, AC coupling is effected with the capacitor C, which does not affect the separation made through the sliding contacts of the variable resistors $VR_1$ and $VR_2$. Therefore, substantially no DC current will flow through the variable resistors $VR_1$ and $VR_2$. If the levels of the DC voltages at the input terminals Li and Ri fluctuate, corresponding currents will of course flow in the variable resistors $VR_1$ and $VR_2$; however, in the case of an ordinary amplifier, such fluctuations are not so large in amplitude and therefore the balance volume control will operate satisfactorily irrespective of such fluctuations.

In the above-described embodiment of the invention, each of the buffer amplifiers in the rear stage of the balance volume control is implemented with a single NPN transistor. However, the buffer amplifier may be constructed with one PNP transistor or a plurality of transistors so long as the resulting circuit uses the DC output of the amplifier in the front stage as its bias voltage.

As is apparent from the above description, according to the invention, DC output voltages in a stage preceding the balance volume control circuit are utilized as bias voltages for amplifiers in the rear stage of the balance volume control circuit, and the sliding contacts of the variable resistors for selectively attenuating the stereo signals are grounded through a common single capacitor. That is, the flow of DC current through the balance volume control circuit is prevented with only one capacitor, which provides a reduction in the number of components and physical space requirements, and thus a decrease of the manufacturing cost.

I claim:

1. In a balance control circuit for controlling the balance between right and left channel audio stereo signals, said balance control circuits having amplifiers in rear stages thereof and a pair of variable resistors for selectively attenuating said stereo signals, the improvement comprising:

means for applying DC output voltages of amplifiers in a preceding stage to said balance volume control circuit as bias voltages to said amplifiers in said rear stage; and a single capacitor for grounding center terminals of said variable resistors.

2. A balance control circuit for controlling the balance between right and left channel audio stereo signals, comprising: first and second input terminals upon which are received respective audio stereo signals superposed on respective DC voltages; first and second amplifying stages; first and second resistors coupled between respective ones of said first and second input terminals and input terminals of said first and second amplifying stages; first and second variable resistors having respective first end terminals coupled to said inputs of said first and second amplifier stages, second end terminals connected together, and center terminals connected together; and a single capacitor coupled between the commonly connected center terminals of said first and second variable resistors and a ground reference point of said amplifying stages.

3. The balance control circuit of claim 2, wherein said amplifying stages each comprise an NPN transistor having an emitter connected through a respective resistor to said ground reference point.

* * * * *